(12) United States Patent
Kim et al.

(10) Patent No.: US 8,173,358 B2
(45) Date of Patent: May 8, 2012

(54) METHOD OF FORMING FINE PATTERNS OF A SEMICONDUCTOR DEVICE

(75) Inventors: Hyoung-hee Kim, Seoul (KR); Yool Kang, Yongin-si (KR); Seong-woon Choi, Suwon-si (KR); Jin-young Yoon, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 474 days.

(21) Appl. No.: 12/432,357

(22) Filed: Apr. 29, 2009

(65) Prior Publication Data

US 2010/0093172 A1 Apr. 15, 2010

(30) Foreign Application Priority Data

Oct. 9, 2008 (KR) .................. 10-2008-0099345

(51) Int. Cl.
*G03F 7/00* (2006.01)
*G03F 7/004* (2006.01)
*G03F 7/20* (2006.01)
*G03F 7/26* (2006.01)
*G03F 7/40* (2006.01)

(52) U.S. Cl. ............. 430/312; 430/270.1; 430/330; 430/331; 430/905; 430/913; 430/317

(58) Field of Classification Search .......... 430/270.1, 430/312, 330, 905, 913, 331, 317
See application file for complete search history.

(56) References Cited

U.S. PATENT DOCUMENTS

| | | | |
|---|---|---|---|
| 6,486,058 B1 * | 11/2002 | Chun | 438/637 |
| 6,534,243 B1 * | 3/2003 | Templeton et al. | 430/312 |
| 7,527,918 B2 * | 5/2009 | Kondoh et al. | 430/312 |
| 7,655,568 B2 * | 2/2010 | Lee et al. | 438/695 |
| 7,666,578 B2 * | 2/2010 | Fischer et al. | 430/314 |
| 7,745,077 B2 * | 6/2010 | Thiyagarajan et al. | 430/14 |
| 7,790,357 B2 * | 9/2010 | Jung | 430/311 |
| 7,799,503 B2 * | 9/2010 | Brodsky et al. | 430/270.1 |
| 7,851,135 B2 * | 12/2010 | Jung et al. | 430/312 |
| 7,923,200 B2 * | 4/2011 | Thiyagarajan et al. | 430/313 |

(Continued)

FOREIGN PATENT DOCUMENTS

JP 2006-261307 9/2006

(Continued)

*Primary Examiner* — Amanda C. Walke
(74) *Attorney, Agent, or Firm* — F. Chau & Associates, LLC

(57) ABSTRACT

A method of forming fine patterns of a semiconductor device includes forming a plurality of first mask patterns on a substrate such that the plurality of first mask patterns are separated from one another by a space located therebetween, in a direction parallel to a main surface of the substrate, forming a plurality of capping films formed of a first material having a first solubility in a solvent on sidewalls and a top surface of the plurality of first mask patterns. The method further includes forming a second mask layer formed of a second material having a second solubility in the solvent, which is less than the first solubility, so as to fill the space located between the plurality of first mask patterns, and forming a plurality of second mask patterns corresponding to residual portions of the second mask layer which remain in the space located between the plurality of first mask patterns, after removing the plurality of capping films and a portion of the second mask layer using the solvent.

20 Claims, 4 Drawing Sheets

U.S. PATENT DOCUMENTS

| | | | |
|---|---|---|---|
| 7,959,818 B2 * | 6/2011 | Jung | 216/46 |
| 7,977,035 B2 * | 7/2011 | Jung | 430/313 |
| 8,026,044 B2 * | 9/2011 | Lee et al. | 430/312 |
| 2006/0147834 A1 * | 7/2006 | Lee et al. | 430/270.1 |
| 2008/0166665 A1 * | 7/2008 | Jung | 430/313 |
| 2009/0203224 A1 * | 8/2009 | Shih et al. | 438/780 |
| 2009/0253086 A1 * | 10/2009 | Volkert et al. | 431/66 |
| 2009/0258318 A1 * | 10/2009 | Chan | 430/312 |
| 2009/0274980 A1 * | 11/2009 | Kang et al. | 430/311 |
| 2009/0280440 A1 * | 11/2009 | Tarutani et al. | 430/325 |
| 2009/0317739 A1 * | 12/2009 | Thiyagarajan et al. | 430/270.1 |
| 2009/0317748 A1 * | 12/2009 | Choi | 430/312 |
| 2010/0035177 A1 * | 2/2010 | Ishikawa et al. | 430/270.1 |
| 2010/0086878 A1 * | 4/2010 | Hatakeyama et al. | 430/324 |
| 2010/0159392 A1 * | 6/2010 | Hatakeyama et al. | 430/286.1 |
| 2010/0311244 A1 * | 12/2010 | Hu et al. | 438/703 |
| 2011/0027993 A1 * | 2/2011 | Moon et al. | 438/689 |

FOREIGN PATENT DOCUMENTS

| | | |
|---|---|---|
| KR | 100155880 | 7/1998 |
| KR | 1020080022974 | 3/2008 |

* cited by examiner

METHOD OF FORMING FINE PATTERNS OF A SEMICONDUCTOR DEVICE

CROSS-REFERENCE TO RELATED APPLICATIONS

This application claims the benefit of Korean Patent Application No. 10-2008-0099345, filed on Oct. 9, 2008, the disclosure of which is hereby incorporated by reference herein in its entirety.

BACKGROUND

The present disclosure relates to a method of forming fine patterns of a semiconductor device, and more particularly, to a method of forming fine patterns of a semiconductor device, by which fine patterns are repeatedly formed at intervals of a fine pitch by using a double patterning process, thereby overcoming a resolution limit of existing exposure equipment.

Forming fine patterns is significant in manufacturing highly integrated semiconductor devices. To integrate many elements within a small area, the size of the individual elements should be minimized. Moreover, to form small elements, a pitch corresponding to a sum of the width of each pattern to be formed and an interval between adjacent patterns should be designed to be small. Furthermore, with the recent reduction in the design rules of semiconductor devices, there may be a limit in forming desired fine-pitch patterns due to a resolution limit in photolithography for forming patterns required to manufacture semiconductor devices. To overcome the resolution limit in such photolithographic processes, some methods of forming fine hard mask patterns having fine pitches by using a double patterning process have been proposed. However, as deposition and etching processes are performed within a fine aperture having a high aspect ratio and a small width according to the double patterning process, the processes may be complex and the manufacturing costs may be high.

Thus, there is a need in the art for a method of forming fine patterns of a semiconductor device which does not require the use of expensive deposition equipment.

SUMMARY

Exemplary embodiments of the present invention may provide a method of forming fine patterns of a semiconductor device using a double patterning process, by which etch mask patterns are formed with a doubled density within a predetermined area by using a chemical reaction without using expensive deposition equipment.

In accordance with an exemplary embodiment of the present invention, a method of forming fine patterns of a semiconductor device is provided. The method includes forming a plurality of first mask patterns on a substrate such that the plurality of first mask patterns are separated from one another by a space located therebetween, in a direction parallel to a main surface of the substrate, forming a plurality of capping films formed of a first material having a first solubility in a solvent on sidewalls and a top surface of the plurality of first mask patterns. The method further includes forming a second mask layer formed of a second material having a second solubility in the solvent, which is less than the first solubility, so as to fill the space located between the plurality of first mask patterns and forming a plurality of second mask patterns, which corresponds to residual portions of the second mask layer which remain in the space located between the plurality of first mask patterns after removing the plurality of capping films and a portion of the second mask layer using the solvent.

The plurality of capping films may be formed of a material including a heterocyclic compound having nitrogen atoms. The plurality of capping films may be attached to the surface of the plurality of first mask patterns by ionic bonds between hydrogen atoms exposed on the surface of the plurality of first mask patterns and nitrogen atoms of the plurality of capping films in the forming of the plurality of capping films.

The solvent may be an alkali aqueous solution.

The second mask layer may be formed so as to fill the space located between the plurality of first mask patterns and completely cover the plurality of capping films formed on the upper portion of the plurality of first mask patterns.

The method may further include removing portions of the second mask layer covering the plurality of capping films formed on the upper portion of the plurality of first mask patterns using the solvent until the plurality of capping films are exposed, before removing the plurality of capping films.

The second mask layer may be formed to only fill the space located between the plurality of first mask patterns so that the plurality of capping films are exposed on the upper portion of the plurality of first mask patterns after forming the second mask layer.

The method may further include decreasing the width of each of the plurality of second mask patterns by removing portions of the plurality of second mask patterns corresponding to residual portions of the second mask layer which remain in the space after removing the plurality of capping films in the forming of the plurality of second mask patterns. The width of each of the plurality of second mask patterns may be decreased using the solvent.

The method may further include hardening the plurality of first mask patterns before forming the plurality of capping films, so that the plurality of first mask patterns are insoluble in an organic solvent.

BRIEF DESCRIPTION OF THE DRAWINGS

Exemplary embodiments of the present invention can be understood in more detail from the following detailed description, taken in conjunction with the accompanying drawings in which.

DETAILED DESCRIPTION OF THE EXEMPLARY EMBODIMENTS OF THE INVENTION

Figure 1A:
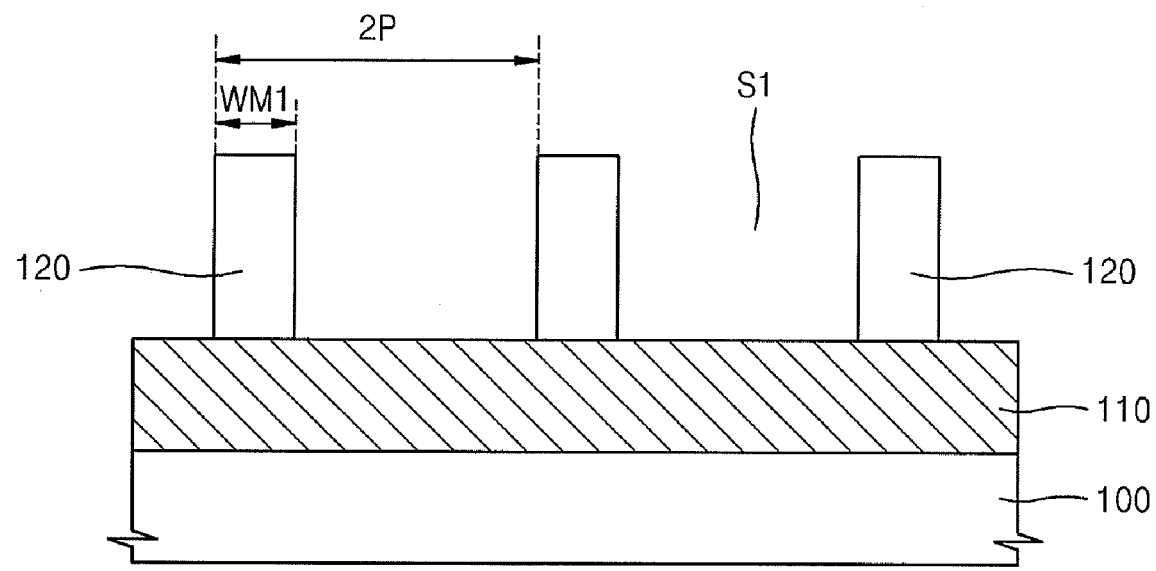
FIGS. 1A to 1H are cross-sectional views for describing a method of forming fine patterns of a semiconductor device, according to an exemplary embodiment of the present invention.

The present invention will now be described more fully with reference to the accompanying drawings, in which exemplary embodiments of the invention are shown. The invention may, however, be embodied in many different forms and should not be construed as being limited to the exemplary embodiments set forth herein. In the drawings, the thicknesses of layers and regions are exaggerated for clarity. Like reference numerals in the drawings denote like elements.

FIGS. 1A to 1H are cross-sectional views for describing a method of forming fine patterns of a semiconductor device, according to an exemplary embodiment of the inventive concept.

Referring to FIG. 1A, a to-be-etched film 110 is formed on a substrate 100, and a plurality of first mask patterns 120 are formed on the to-be-etched film 110.

The plurality of first mask patterns 120 are equally separated from one another by a space S1 in a direction parallel to a main surface of the substrate 100.

The plurality of first mask patterns 120 may, for example, be repeatedly formed at intervals of a first pitch 2P, which is twice as large as a pitch P of a plurality of fine patterns to be formed on the to-be-etched film 110. The width WM1 of each of the first mask patterns 120 may be the same as that of each the fine patterns to be formed on the to-be-etched film 110. The width WM1 of each of the first mask patterns 120 may also be less or greater than that of each of the fine patterns to be formed on the to-be-etched film 110.

The substrate 100 may be, for example, a silicon substrate.

The to-be-etched film 110 may be formed of any material according to the purpose of the fine patterns that are to be formed on the to-be-etched film 110.

If a gate electrode is formed on the substrate 100, the to-be-etched film 110 may be a conductive layer, for example a doped polysilicon layer or a stacked structure including the doped polysilicon layer and a metal silicide layer. If bit lines are formed on the substrate 100, the to-be-etched film 110 may be formed of a metal, for example, tungsten or aluminum. Alternatively, the to-be-etched film 110 may be, for example, an insulating film used for a mold layer in a damascene method. If fine patterns to be finally formed are formed by etching the substrate 100, the to-be-etched film 110 may not be formed. For example, if active regions are defined in the substrate 100 by using a method according to exemplary embodiments of the present invention, the to-be-etched film 110 may not be formed. In some cases, before the first mask patterns 120 are formed on the to-be-etched film 110, an antireflective film formed of, for example, an organic material, an inorganic material, or a combination thereof may further be formed on the to-be-etched film 110.

The first mask patterns 120 may be formed of, for example, an organic material. For example, the first mask patterns 120 may be resist patterns formed of a conventional resist composition. To form the first mask patterns 120, for example, a resist film may be formed by coating a top surface of the to-be-etched film 110 with a photoresist material, and then, the resist film may undergo exposure and development according to a typical photolithographic process so as to form resist patterns having apertures that expose portions of the top surface of the to-be-etched film 110. The portions may have predetermined widths, for example, the width of the space S1.

For example, the first mask patterns 120 may be formed of a positive type chemical amplification resist composition that includes a photoacid generator (PAG). In this regard, the first mask patterns 120 may be formed of, for example, a resist composition for a KrF excimer laser (248 nm), a resist composition for an ArF excimer laser (193 nm), or a resist composition for a EUV (13.5 nm). Alternatively, the first mask patterns 120 may be formed of, for example, a negative type resist composition.

Figure 1B:
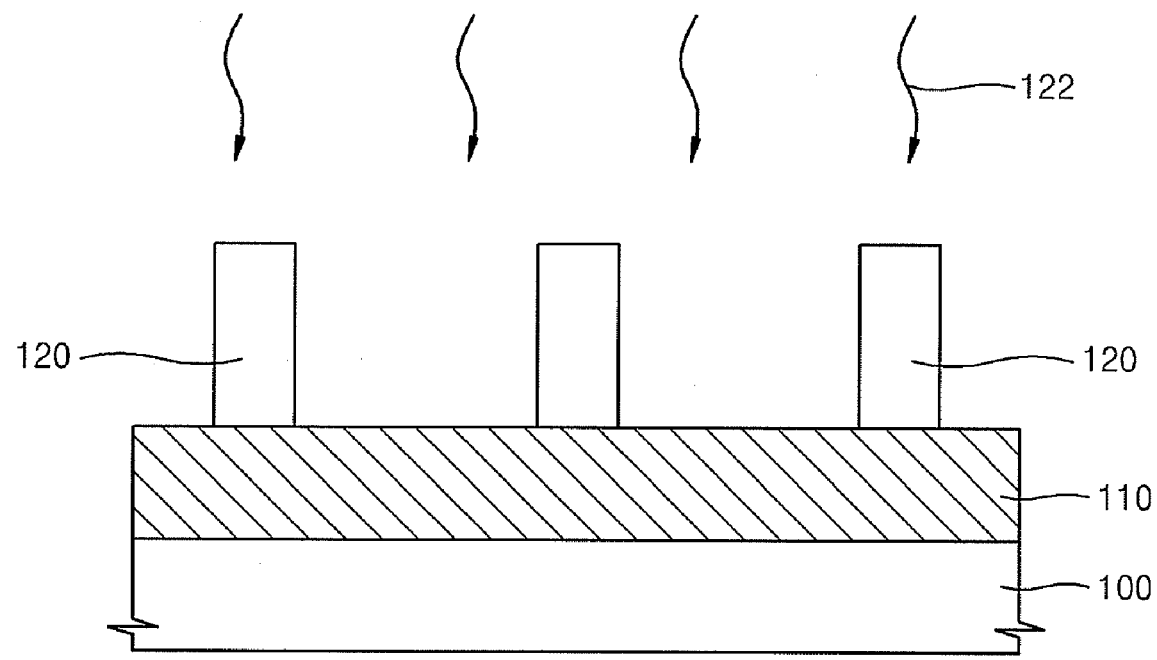

Referring to FIG. 1B, the first mask patterns 120 may undergo hardening 122. The hardening 122 may be performed by, for example, a thermal, an Ar plasma, or a HBr plasma treatment. If the thermal treatment is used to harden the first mask patterns 120, a resultant substrate on which the first mask patterns 120 are formed is thermally treated at a temperature ranging from, for example about 50 to about 200° C. for about several seconds to about several minutes, for example, for 1 minute. If the HBr plasma treatment is used to harden the first mask patterns 120, plasma is generated by loading a resultant substrate 100 on which the first mask patterns 120 are formed onto an electrostatic chuck of a plasma treatment chamber, introducing HBr gas into the plasma treatment chamber, and applying power to the chamber. If required, a source power of about 10 to about 2000 W is applied to an upper electrode of the plasma treatment chamber, and a bias power of about 0 W is applied to the electrostatic chuck in the plasma treatment chamber to generate HBr plasma in the plasma treatment chamber. At least one gas selected from the group consisting of, for example, $H_2$, $N_2$, and $C_xH_y$, wherein x and y are an integer ranging from 1 to 10, may also be introduced into the plasma treatment chamber. A small amount of UV exposure or heat may be generated in the HBr plasma treatment process. In addition, various reactive species such as, for example, ions and radicals may be incidentally generated in the plasma treatment process. These incidental energy or reactive species may harden the first mask patterns 120 to the extent that the hardening 122 does not affect a line width of the first mask patterns 120.

The hardening 122 is performed to prevent the first mask patterns 120 from being dissolved in an organic solvent and intermixed with adjacent layers in a subsequent process when the first mask patterns 120 are exposed to the organic solvent. Due to the hardening 122, the first mask patterns 120 may have insolubility against an organic solvent such as, for example, propylene glycol methyl ether acetate (PGMEA), ethyl lactate (EL), and cyclohexanone.

If the first mask patterns 120 are not exposed to an organic solvent in a subsequent process, the hardening 122 of the first mask patterns 120 shown in FIG. 1B may not be performed.

Figure 1C:
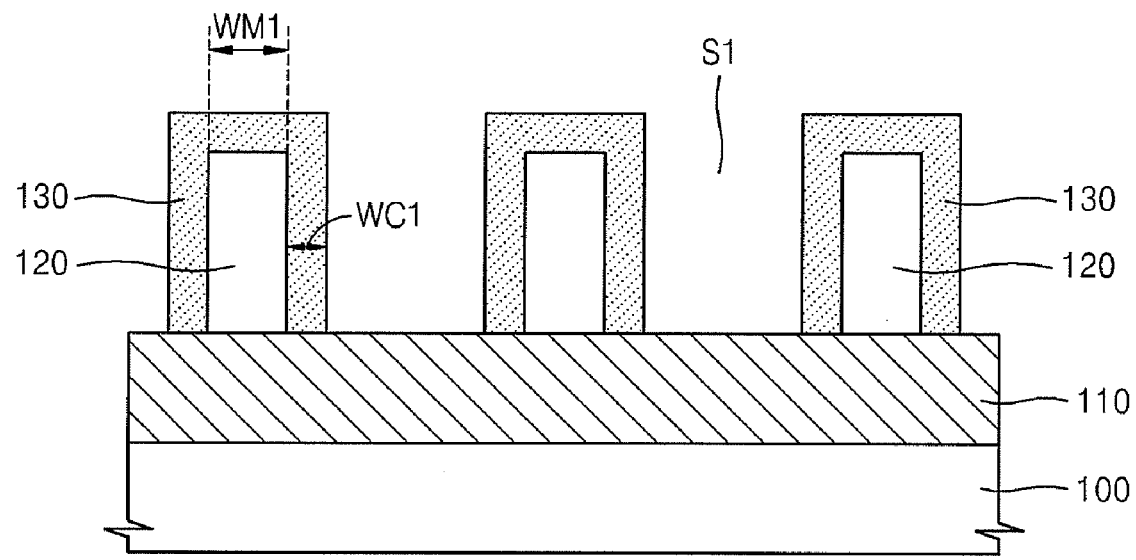

Referring to FIG. 1C, a plurality of capping films 130 are formed respectively on sidewalls and a top surface of the plurality of first mask patterns 120.

The capping films 130 may be formed of, for example, a hydrophilic organic compound. In addition, the capping films 130 may be formed of, for example, a heterocyclic compound having nitrogen atoms or a polymer including a substituent of a heterocyclic compound having nitrogen atoms. For example, the capping films 130 may include a pyrrolidone-based polymer. The capping films 130 may be formed of, for example, a water-soluble polymer. The water-soluble polymer may be, for example, a copolymer including a pyrrolidone-based first repeating unit and a second repeating unit having a structure different from the pyrrolidone-based first repeating unit. The second repeating unit may include, for example, at least one monomer unit selected from the group consisting of an acrylamide type monomer unit, a vinyl type monomer unit, an alkylene glycol type monomer unit, a maleic anhydride monomer unit, an ethyleneimine monomer unit, a monomer unit including an oxazoline group, an acrylonitrile monomer unit, an allylamide monomer unit, a 3,4-dihydropyran monomer unit, and a 2,3-dihydrofuran monomer unit.

For example, the capping films 130 may be formed by coating a capping composition including a water-soluble polymer including a heterocyclic compound having nitrogen atoms and deionized water on the first mask patterns 120, and attaching the water-soluble polymer to the surface of the exposed first mask patterns 120 by baking the resultant at a temperature ranging from about 25 to about 180° C. for about 20 to about 180 seconds. After the capping films 130 are formed, residues that remain on the surface of the capping films 130 may be removed by a cleaning process using, for example, deionized water. The capping films 130 may also be formed by, for example, spin-coating a capping composition including R-607, which is Resolution Enhancement Lithography Assisted by Chemical Shrink (RELACS™) produced by AZ Electronic Materials, and deionized water on the first mask patterns 120, and attaching R-607 to the surface of the exposed first mask patterns 120 by baking the resultant at a temperature ranging from about 140 to about 150° C. for about 1 minute. Then, residues that remain on the surface of the capping films 130 may be removed by a cleaning process using, for example, deionized water.

The thickness of the capping films 130 may vary according to the width of the desired pattern. For example, the width WC1 of each of the capping films 130 may be designed to be a half of or less than the width WM1 of each of the first mask patterns 120 when viewed from the side.

If the aqueous composition for forming the capping film 130 includes a heterocyclic compound having nitrogen atoms, the heterocyclic compound may be attached to the surface of the first mask patterns 120 by ionic bonds between nitrogen atoms included in the heterocyclic compound and hydrogen atoms exposed on the surface of the first mask patterns 120 to form the capping films 130.

The capping films 130 may further include, for example, an acid generator. The acid generator may be a potential acid, such as a thermal acid generator (TAG), or an acid. Various acids may be used and the type of the acid is not limited. For example, sulfonic acids such as $CH_3SO_3H$ may be used. The acid generator included in the capping films 130 may, for example, be diffused into a second mask layer 140 (FIG. 1D) formed in the space S1 between the capping films 130 in a subsequent process and used to control the width of the second mask layer 140, as will be described in more detail later.

Figure 1D:
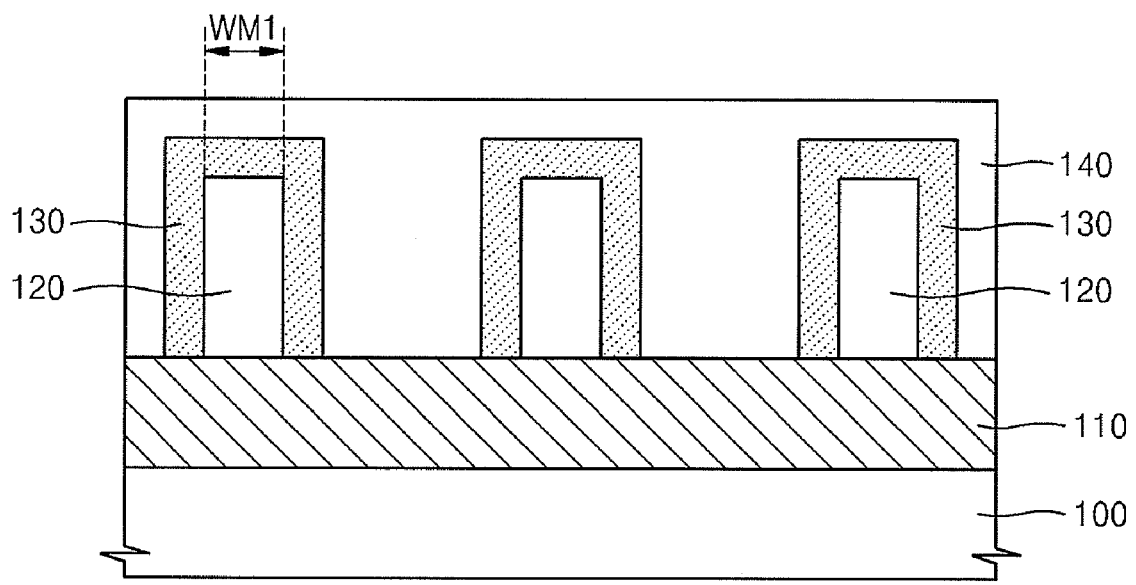

Referring to FIG. 1D, a second mask layer 140, which fills the space S1 on the to-be-etched film 110, is formed on the capping films 130.

The second mask layer 140 may be formed of, for example, a resist composition. In this regard, the resist composition forming the second mask layer 140 may be a positive type or negative type chemical amplification resist composition. For example, the second mask layer 140 may be formed of a resist composition for a KrF excimer laser (248 nm), a resist composition for an ArF excimer laser (193 nm), or a resist composition for a EUV (13.5 nm). As the second mask layer 140 does not undergo exposure or acid treatment in a subsequent process, a material which does not include a potential acid such as, for example, a photoacid generator (PAG) or a TAG may be used as a resist composition for forming the second mask layer 140.

The second mask layer 140 is formed of a material having a solubility in a solvent, for example, an alkali aqueous solution such as a standard 2.38 wt % tetramethylammonium hydroxide (TMAH) aqueous solution, wherein the solubility is lower than that of the capping films 130. For example, the solubility of the material forming the second mask layer 140 in an alkali aqueous solution may be about 1 to about 10 Å/sec. The second mask layer 140 may be formed of, for example, a resist material having dark erosion in which unexposed regions of a resist film are dissolved in or developed by a developing solution. However, the second mask layer 140 is formed using a resist material having a relatively low level dark erosion compared to that of the capping films 130, so that the solubility of the second mask layer 140 in a developing solution is less than that of the capping films 130. Most of the resist materials commonly known in the art have lower dark erosion compared with R-607, which is a RELACS™. For example, the second mask layer 140 may be formed of a resist material including a polymer having a polyhydroxy styrene (PHS) monomer unit, a polymer having an acetal protecting group, or a (meth)acrylate-based monomer unit. The material used to form the second mask layer 140 is not limited, and any resist material that is commonly used in the art and has a desired degree of dark erosion may be used. If the capping film 130 is formed of R-607, and the second mask layer 140 has a solubility of about 1 to about 10 Å/sec in a 2.38 wt % TMAH aqueous solution, the solubility of the second mask layer 140 in the developing solution may be less than that of the capping films 130.

Although it is illustrated in FIG. 1D that the second mask layer 140 is formed having a top surface higher than the top surfaces of the capping films 130, the present invention is not limited to this formation. In addition, after forming the second mask layer 140, the second mask layer 140 may be formed to have a height equal to or less than that of the top surface of each of the capping films 130 so that the capping films 130 are exposed on the upper portion of the first mask patterns 120. That is, the second mask layer 140 may be formed only in the space S1. The second mask layer 140 may be formed by, for example, spin-coating a solution obtained by dissolving a resist material in an organic solvent on the to-be-etched film 110 and the capping film 130 and removing the organic solvent using a drying or baking process.

If the capping films 130 include an acid generator, the acid generator may be diffused into the second mask layer 140 to a predetermined distance while the second mask layer 140 is formed. If the acid generator is a TAG, acid generated by the TAG is diffused into the second mask layer 140 during the baking process after the coating of the resist composition. If the acid generator is an acid, the acid may be diffused into the second mask layer 140 while the second mask layer 140 is formed. The width of a plurality of second mask patterns 140A obtained from the second mask layer 140 in a subsequent process may be controlled according to, for example, the distance by which the acid is diffused in the second mask layer 140.

Figure 1E:
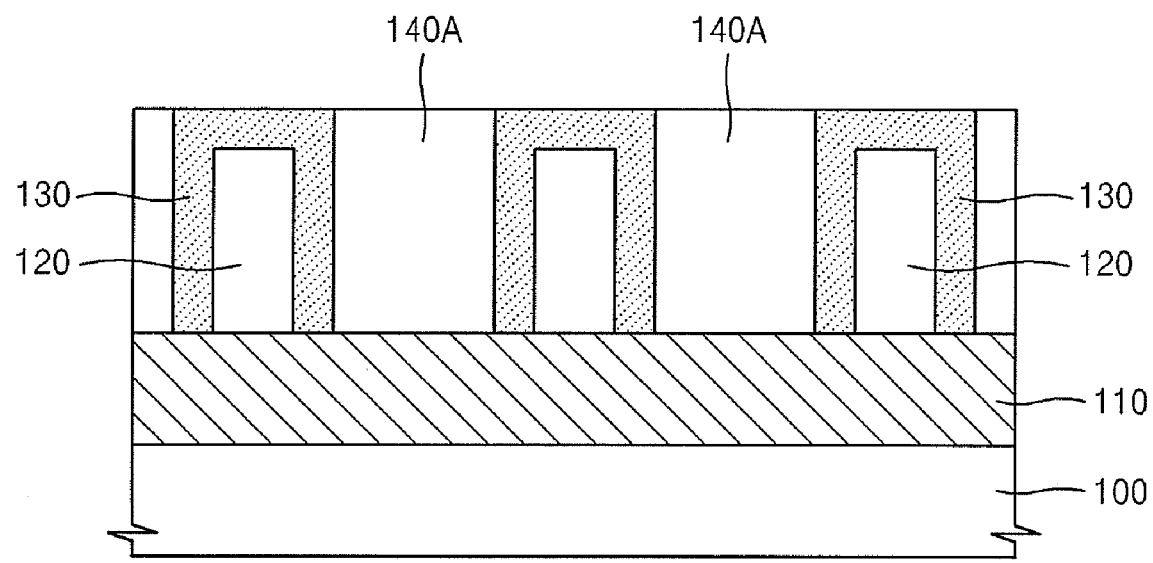

Referring to FIG. 1E, the top surface of the second mask layer 140 is dissolved using a solvent until the capping films 130 are exposed. The solvent may be, for example, an alkali aqueous solution such as standard 2.38 wt % TMAH aqueous solution.

As the capping films 130 are exposed, a plurality of second mask patterns 140A are formed in the space S1 between the first mask patterns 120.

If the second mask layer 140 is formed to have a height equal to or less than that of the top surface of each of the capping films 130, as shown in FIG. 1D, the process described with reference to FIG. 1E may be omitted.

Figure 1F:
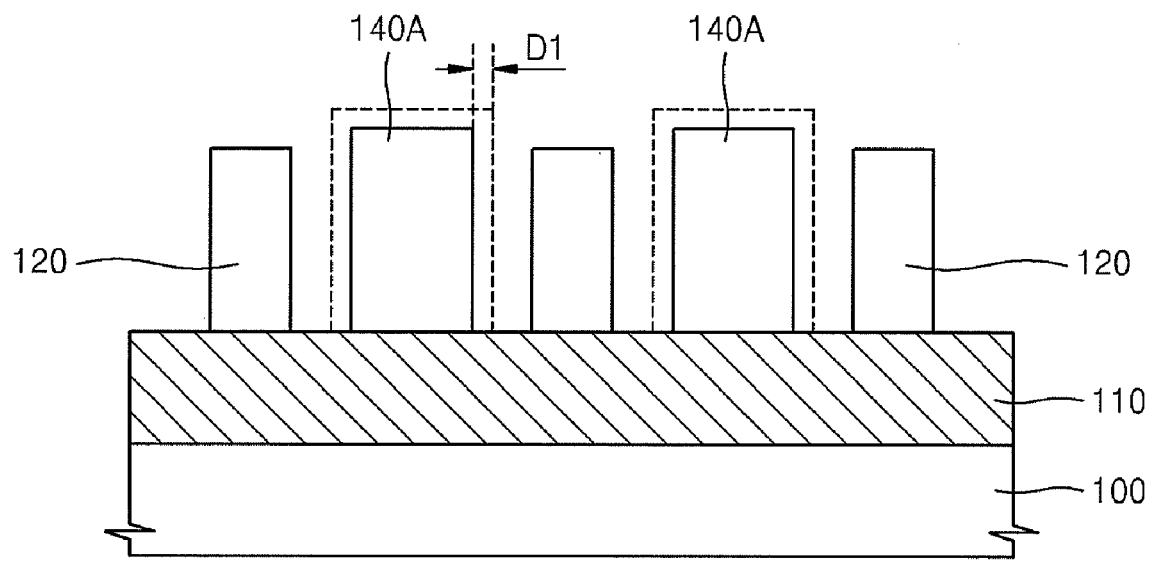

Referring to FIG. 1F, the plurality of second mask patterns 140A and the exposed capping film 130 are dissolved using the solvent, followed by the process described with reference to FIG. 1E.

As a result, the capping films 130 are removed before the second mask layer 140 due to the solubility difference in the solvent between the second mask layer 140 and the capping films 130. While the capping films 130 are removed, the surface of the second mask layer 140 exposed to the alkali aqueous solution may also be removed by a predetermined thickness D1.

Figure 1G:
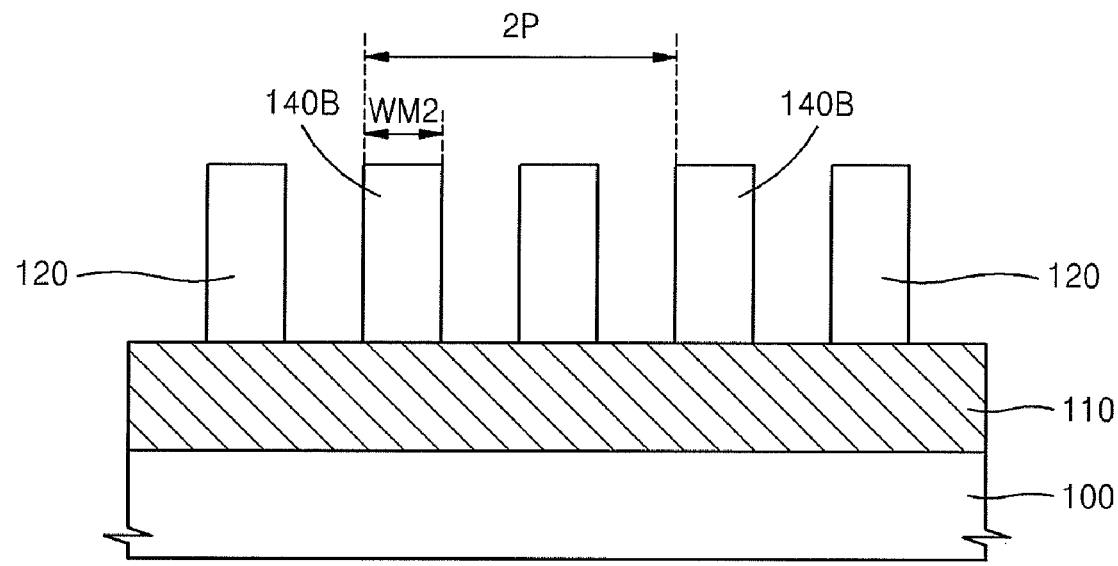

Referring to FIG. 1G, a plurality of second mask patterns 140B having a desired width WM2 each are formed by removing portions of the exposed surface of the plurality of second mask patterns 140A using the solvent followed by the process described with reference to FIG. 1F.

If the second mask patterns 140A obtained by completely removing the capping films 130 each have a desired width by the process described with reference to FIG. 1F, the process described with reference to FIG. 1G may be omitted.

If the capping films 130 are formed including an acid generator in the formation of the capping films 130, as shown in FIG. 1C, acid diffused regions, which are formed in the second mask layer 140 by the acid diffused in the second mask layer 140, may be readily dissolved in the solvent. For example, if an alkali aqueous solution is used as the solvent, the acid diffused regions may be readily dissolved and removed by acid-alkali reactions. Thus, when the acid generator is included in the capping films 130, the width of each of the second mask patterns 140A that remain after removing the capping films 130 decreases compared with when no acid generator is included in the capping film 130 according to, for example, the distance by which acid is diffused. Alternatively, the sidewalls of the second mask patterns 140A may have an excellent profile shape according to, for example, the distance by which acid is diffused.

If desired, the plurality of second mask patterns 140B may be repeatedly formed at intervals of a first pitch 2P, which is twice as large as a pitch P of a plurality of fine patterns to be formed on the to-be-etched film 110. The width WM2 of each of the second mask patterns 140B may be the same as that of each of the fine patterns to be formed on the to-be-etched film 110.

Figure 1H:
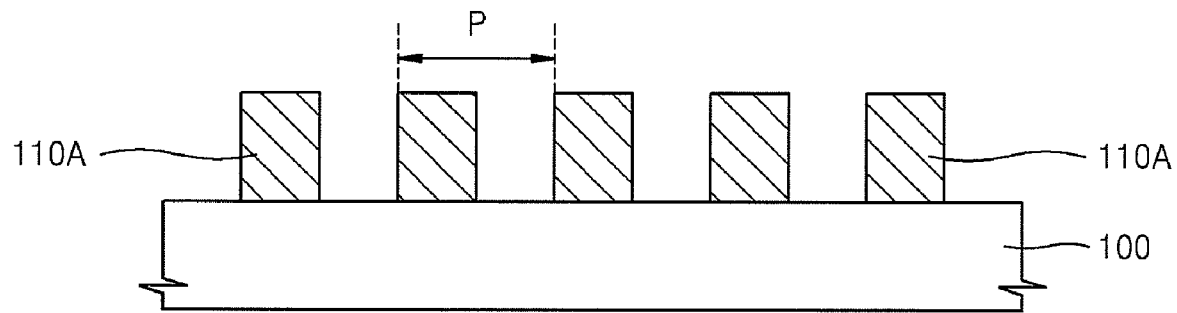

Referring to FIG. 1H, the to-be-etched film 110 is etched to form the plurality of fine patterns 110A using the plurality of first mask patterns 120 and the plurality of second mask patterns 140B as etching masks.

After forming the fine patterns 110A, the plurality of first mask patterns 120 and the plurality of second mask patterns 140B that remain on the fine patterns 110A are removed. For example, an ashing and stripping process may be performed to remove the plurality of first mask patterns 120 and the plurality of second mask patterns 140B.

The plurality of fine patterns 110A may be repeatedly formed at intervals of a fine pitch P, which is a half of the first pitch 2P (FIG. 1A).

If the formation of the to-be-etched film 110 is omitted in the process described with reference to FIG. 1A, the substrate 100 may be etched using the first mask patterns 120 and the second mask patterns 140B as etching masks.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of forming fine patterns of a semiconductor device, the method comprising:
    forming a plurality of first mask patterns on a substrate such that the plurality of first mask patterns are separated from one another by a space located therebetween, in a direction parallel to a main surface of the substrate;
    forming a plurality of capping films formed of a first material having a first solubility in a solvent on sidewalls and a top surface of the plurality of first mask patterns;
    forming a second mask layer formed of a second material having a second solubility in the solvent, which is less than the first solubility, so as to fill the space located between the plurality of first mask patterns; and
    forming a plurality of second mask patterns corresponding to residual portions of the second mask layer which remain in the space located between the plurality of first mask patterns after removing the plurality of capping films and a portion of the second mask layer using the solvent.

2. The method of claim 1, wherein the plurality of capping films are formed of a material comprising a heterocyclic compound having nitrogen atoms.

3. The method of claim 1, wherein the plurality of capping films are attached to the surface of the plurality of first mask patterns by ionic bonds with hydrogen atoms exposed on the surface of the plurality of first mask patterns.

4. The method of claim 3, wherein the plurality of capping films are attached to the surface of the plurality of first mask patterns by ionic bonds between hydrogen atoms exposed on the surface of the plurality of first mask patterns and nitrogen atoms of the plurality of capping films.

5. The method of claim 1, wherein the solvent is an alkali aqueous solution.

6. The method of claim 1, wherein the solvent is a standard 2.38 wt % tetramethylammonium hydroxide (TMAH) aqueous solution.

7. The method of claim 1, wherein the second mask layer is formed of a resist composition.

8. The method of claim 1, wherein the second mask layer comprises a polymer having a polyhydroxy styrene (PHS) monomer unit.

9. The method of claim 1, wherein the second mask layer comprises a polymer having an acetal protecting group.

10. The method of claim 1, wherein the plurality of capping films further comprise an acid generator.

11. The method of claim 1, wherein the second mask layer is formed so as to fill the space located between the plurality of first mask patterns and completely cover the plurality of capping films formed on the upper portion of the plurality of first mask patterns.

12. The method of claim 11, further comprising removing portions of the second mask layer covering the plurality of capping films formed on the upper portion of the plurality of first mask patterns using the solvent until the plurality of capping films are exposed, before removing the plurality of capping films.

13. The method of claim 1, wherein the second mask layer is formed to only fill the space located between the plurality of first mask patterns so that the plurality of capping films are exposed on the upper portion of the plurality of first mask patterns after forming the second mask layer.

14. The method of claim 1, further comprising decreasing a width of each of the plurality of second mask patterns by removing portions of the plurality of second mask patterns corresponding to residual portions of the second mask layer which remain in the space located between the plurality of first mask patterns after removing the plurality of capping films in the forming of the plurality of second mask patterns.

15. The method of claim 14, wherein the width of each of the plurality of second mask patterns is decreased using the solvent.

16. The method of claim 1, wherein the plurality of first mask patterns are formed of an organic material.

17. The method of claim 16, further comprising hardening the plurality of first mask patterns before forming the plurality of capping films, so that the plurality of first mask patterns are insoluble in an organic solvent.

18. The method of claim 17, wherein the plurality of first mask patters are hardened using at least one treatment selected from the group consisting of a thermal treatment and a plasma treatment.

19. The method of claim 1, wherein the forming of the plurality of capping films comprises:
    coating a capping composition comprising a water-soluble polymer and water on the surface of the exposed plurality of first mask patterns; and
    thermally treating the resultant coated capping composition.

20. The method of claim 1, further comprising etching the substrate using the plurality of first mask patterns and the plurality of second mask patterns as etching masks.

* * * * *